(12) United States Patent
Harada

(10) Patent No.: US 9,362,873 B2
(45) Date of Patent: Jun. 7, 2016

(54) INSTRUMENTATION AMPLIFIER

(71) Applicant: OLYMPUS CORPORATION, Tokyo (JP)

(72) Inventor: Yasunari Harada, Ebina (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/810,853

(22) Filed: Jul. 28, 2015

(65) Prior Publication Data

US 2015/0333715 A1  Nov. 19, 2015

Related U.S. Application Data

(63) Continuation of application No. PCT/JP2014/051936, filed on Jan. 29, 2014.

(30) Foreign Application Priority Data

Apr. 12, 2013  (JP) .................. 2013-084166

(51) Int. Cl.
*H03F 3/45* (2006.01)
(52) U.S. Cl.
CPC ........ *H03F 3/45179* (2013.01); *H03F 3/45197* (2013.01); *H03F 2200/261* (2013.01); *H03F 2203/45026* (2013.01)
(58) Field of Classification Search
CPC ......................................................... H03F 3/45
USPC ................................................. 330/253, 261
See application file for complete search history.

(56) References Cited

U.S. PATENT DOCUMENTS 6,356,152 B1  3/2002 Jezdic et al.
6,369,658 B1  4/2002 Nilson
(Continued)

FOREIGN PATENT DOCUMENTS

JP  2011-228935 A  11/2011
JP  2012-50006 A  3/2012
WO  2009/087482 A2  7/2009

OTHER PUBLICATIONS

Yagicioglu et al., "A 200 μW Eight-Channel EEG Acquisition ASIC for Ambulatory EEG Systems", IEEE Journal of Solid-State Circuits, Dec. 2008, vol. 43, No. 12, pp. 3025-3038.
(Continued)

*Primary Examiner* — Khanh V Nguyen
*Assistant Examiner* — Khiem Nguyen
(74) *Attorney, Agent, or Firm* — Westerman, Hattori, Daniels & Adrian, LLP

(57) ABSTRACT

An instrumentation amplifier includes: a first input stage configured to shift a level of a first input voltage applied to a first input terminal and to output the level-shifted voltage; a second input stage configured to shift a level of a second input voltage applied to a second input terminal and to output the level-shifted voltage; a first resistor configured to generate a differential current corresponding to a difference between the voltage output from the first input stage and the voltage output from the second input stage; a second resistor configured to convert the differential current into a first output voltage; a third resistor configured to convert the differential current into a second output voltage; a first output stage configured to output the first output voltage from a first output terminal; and a second output stage configured to output the second output voltage from a second output terminal.

3 Claims, 5 Drawing Sheets

(56) References Cited

U.S. PATENT DOCUMENTS

| | | |
|---|---|---|
| 8,319,553 B1 | 11/2012 | Ivanov |
| 2011/0254626 A1 | 10/2011 | Harada |
| 2012/0049958 A1 | 3/2012 | Takei |

OTHER PUBLICATIONS

International Search Report dated Apr. 8, 2014, issued in counterpart Application No. PCT/JP2014/051936 (2 pages).

PRIOR ART

INSTRUMENTATION AMPLIFIER

This application claims is a continuation application of International Patent Application No. PCT/JP2014/051936, filed on Jan. 29, 2014, whose priority is claimed on Japanese Patent Application No. 2013-084166, filed on Apr. 12, 2013, the contents of both of the International Patent Application and the Japanese Patent Application are incorporated herein by reference in their entirety.

BACKGROUND OF THE INVENTION

1. Field of the Invention

The present invention relates to an instrumentation amplifier that amplifies output signals of various sensors or the like.

2. Description of Related Art

In the related art, an instrumentation amplifier has been used to receive an output signal of various sensors or the like with high impedance and to amplify the output signal with high accuracy (for example, see Refet Firat Yagicioglu, A 200 uW Eight-Channel EEG Acquisition ASIC for Ambulatory EEG Systems, IEEE Journal Solid-State Circuits, Vol. 43, No. 12, December, 2008, pp. 3025-3038). A configuration of the instrumentation amplifier described in this document will be described below.

FIG. 3 shows the configuration of the instrumentation amplifier described in Refet Firat Yagicioglu, A 200 uW Eight-Channel EEG Acquisition ASIC for Ambulatory EEG Systems, IEEE Journal Solid-State Circuits, Vol. 43, No. 12 December, 2008, pp. 3025-3038. As shown in FIG. 3, an instrumentation amplifier 100 includes a first input stage 101, a second input stage 102, a first resistor R1, and a second resistor R2.

The first input stage 101 shifts a level of a positive input voltage (Vinp) applied to a positive input terminal and outputs the level-shifted voltage. The second input stage 102 shifts a level of a negative input voltage (Vinn) applied to a negative input terminal and outputs the level-shifted voltage. The first resistor R1 is connected between the first input stage 101 and the second input stage 102 and generates a differential current ($\Delta$Iin=$\Delta$Vin/R1) corresponding to the voltage of a difference ($\Delta$Vin=Vinp−Vinn) between the output voltage of the first input stage 101 and the output voltage of the second input stage 102. The second resistor R2 is connected between the first input stage 101 and the second input stage 102 and converts the differential current $\Delta$Iin generated by the first resistor R1 into a first output (Voutp) and a second output voltage (Voutn).

The first input stage 101 includes transistors M1 and M2, current sources I1, I2, and I3, and a level shift circuit LS1. The gate terminal of the transistor M1 is connected to the positive input terminal, and the source terminal of the transistor M1 is connected to a first end of the first resistor R1. A first end of the current source I1 is connected to the source terminal of the transistor M1 and the first end of the first resistor R1, and a second end of the current source I1 is connected to the highest potential. The drain terminal of the transistor M2 is connected to the source terminal of the transistor M1, the first end of the first resistor R1, and the first end of the current source I1, and the source terminal of the transistor M2 is connected to a negative output terminal. A first end of the current source I2 is connected to the source terminal of the transistor M2 and a first end of the second resistor R2, and a second end of the current source I2 is connected to the lowest potential. A first end of the current source I3 is connected to the drain terminal of the transistor M1, and a second end of the current source I3 is connected to the lowest potential. A first end of the level shift circuit LS1 is connected to the drain terminal of the transistor M1, and a second end of the level shift circuit LS1 is connected to the gate terminal of the transistor M2.

The second input stage 102 includes transistors M3 and M4, current sources I4, I5, and I6, and a level shift circuit LS2. The gate terminal of the transistor M3 is connected to the negative input terminal, and the source terminal of the transistor M3 is connected to a second end of the first resistor R1. A first end of the current source I4 is connected to the source terminal of the transistor M3 and the second end of the first resistor R1, and a second end of the current source I4 is connected to the highest potential. The drain terminal of the transistor M4 is connected to the source terminal of the transistor M3, the second end of the first resistor R1, and the first end of the current source I4, and the source terminal of the transistor M4 is connected to a positive output terminal. A first end of the current source I5 is connected to the source terminal of the transistor M4 and a second end of the second resistor R2, and a second end of the current source I5 is connected to the lowest potential. A first end of the current source I6 is connected to the drain terminal of the transistor M3, and a second end of the current source I6 is connected to the lowest potential. A first end of the level shift circuit LS2 is connected to the drain terminal of the transistor M3, and a second end of the level shift circuit LS2 is connected to the gate terminal of the transistor M4.

The operation of the instrumentation amplifier 100 will be described below. When the positive input voltage (Vinp) is applied to the gate terminal of the transistor M1, the first input stage 101 outputs a voltage of the sum of the positive input voltage (Vinp) and the gate-source voltage (Vgs) of the transistor M1. This voltage is output from the first input stage 101 and is applied to the first end of the first resistor R1. When the negative input voltage (Vinn) is applied to the gate terminal of the transistor M3, the second input stage 102 outputs a voltage of the sum of the negative input voltage (Vinn) and the gate-source voltage (Vgs) of the transistor M3. This voltage is output from the second input stage 102 and is applied to the second end of the first resistor R1. Accordingly, the voltage of the difference ($\Delta$Vin=Vinp−Vinn) between the positive input voltage (Vinp) and the negative input voltage (Vinn) is supplied to the first resistor R1.

The first resistor R1 generates the differential current ($\Delta$Iin=$\Delta$Vin/R1) corresponding to the differential voltage ($\Delta$Vin=Vinp−Vinn) and supplies an operating current from the current sources I1 and I4 to the transistors M2 and M4 based on the differential current ($\Delta$Iin=$\Delta$Vin/R1). The current sources I2 and I5 sink the operating current supplied to the transistors M2 and M4 and the current sources I3 and I6 keep the operating current of the transistors M1 and M3 constant.

The current source I1 supplies the operating current set by the current source I3 to the transistor M1 and supplies the operating current corresponding to the differential current ($\Delta$Iin=$\Delta$Vin/R1) generated in the first resistor R1 to the transistor M2. The current source I4 supplies the operating current set by the current source I6 to the transistor M3 and supplies the operating current corresponding to the differential current ($\Delta$Iin=$\Delta$Vin/R1) generated in the first resistor R1 to the transistor M4. The second resistor R2 converts the differential current ($\Delta$Iin=$\Delta$Vin/R1) generated in the first resistor R1 into a first output voltage (Voutp) and a second output voltage (Voutn).

More specifically, the differential current ($\Delta$Iin=$\Delta$Vin/R1) is a part of the operating current supplied from the current sources I1 and I4 and is expressed by Equations (1) to (3). In Equations (1) to (3), the operating currents supplied from the current sources I2, I3, I5, and I6 are Ibias, the operating currents supplied from the current sources I1 and I4 are 2Ibias, the operating current of the transistor M2 is Im2, and the operating current of the transistor M4 is Im4.

If positive input voltage (Vinp)>negative input voltage (Vinn), $$I_{m4} = I_{bias} + \Delta I_{in} \quad (1)$$

$$I_{m2} = I_{bias} - \Delta I_{in}$$

$$\Delta I_{in} = \frac{Vinp - Vinn}{R_1} = \frac{\Delta V_{in}}{R_1} > 0$$

If positive input voltage (Vinp)<negative input voltage (Vinn), $$I_{m4} = I_{bias} - \Delta I_{in} \quad (2)$$

$$I_{m2} = I_{bias} + \Delta I_{in}$$

$$\Delta I_{in} = \frac{Vinp - Vinn}{R_1} = \frac{\Delta V_{in}}{R_1} < 0$$

If positive input voltage (Vinp)=negative input voltage (Vinn), $$I_{m4} = I_{m2} = I_{bias} \quad (3)$$

$$\Delta I_{in} = \frac{Vinp - Vinn}{R_1} = \frac{\Delta V_{in}}{R_1} = 0$$

Since all the operating currents (Im2 and Im4) supplied to the transistors M2 and M4 are sunken by the current sources i2 and I5, the entire differential current ($\Delta$Iin=$\Delta$Vin/R1) is supplied to the second resistor R2. Accordingly, when the voltage of the difference between the first output voltage (Voutp) and the second output voltage (Voutn) is defined as $\Delta$Vout, Equations (4) and (5) are obtained.

If positive input voltage (Vinp)>negative input voltage (Vinn), $$V_{outp} = \Delta I_{in} \times R_2 = \frac{R_2}{R_1} \Delta V_{in} \quad (4)$$

$$V_{outn} = -\Delta I_{in} \times R_2 = -\frac{R_2}{R_1} \Delta V_{in}$$

$$\Delta V_{out} = V_{outp} - V_{outn} = 2\frac{R_2}{R_1} \Delta V_{in}$$

If positive input voltage (Vinp)<negative input voltage (Vinn), $$V_{outp} = -\Delta I_{in} \times R_2 = -\frac{R_2}{R_1} \Delta V_{in} \quad (5)$$

$$V_{outn} = -\Delta I_{in} \times R_2 = \frac{R_2}{R_1} \Delta V_{in}$$

$$\Delta V_{out} = V_{outp} - V_{outn} = -2\frac{R_2}{R_1} \Delta V_{in}$$

Therefore, the instrumentation amplifier 100 amplifies the voltage of the difference ($\Delta$Vin=Vinp-Vinn) between the positive input voltage (Vinp) and the negative input voltage (Vinn) by 2(R2/R1) times based on the resistance ratio of the first resistor R1 and the second resistor R2.

In the instrumentation amplifier 100, it is necessary to set the current supplied from the current sources I1 and I4 to 2Ibias and to set the current sunken by the current sources I2, I3, I5, and I6 to Ibias. In this case, the sum of currents flowing from the highest potential to the current sources I1 and I4 is equal to the sum of currents flowing from the current sources I2, I3, I5, and I6 to the lowest potential. The differential current ($\Delta$Iin=$\Delta$Vin/R1) flowing in the first resistor R1 and the differential current ($\Delta$Iin=$\Delta$Vin/R1) flowing in the second resistor R2 have the same magnitude and opposite directions. Accordingly, a current flowing from the positive output terminal to the outside or a current flowing from the outside to the positive output terminal is substantially zero. Similarly, a current flowing from the negative output terminal to the outside or a current flowing from the outside to the negative output terminal is substantially zero.

Accordingly, output current capability indicating the current flowing from the positive output terminal and the negative output terminal of the instrumentation amplifier 100 to the outside or the current flowing from the outside to the positive output terminal and the negative output terminal of the instrumentation amplifier 100 is substantially zero. As a result, when impedance of a load or a circuit connected to the rear stage of the instrumentation amplifier 100 is not set to be very large, the output voltage is attenuated.

More specifically, as shown in FIG. 4, when a capacitive feedback variable-gain circuit 200 is connected to the rear stage of the instrumentation amplifier 100, the input impedance of the variable-gain circuit 200 becomes a small value (i/j$\omega$c) due to the impedance of the capacitance (c) on an input side and the output voltage of the instrumentation amplifier 100 is attenuated. Accordingly, as shown in FIG. 5, it is necessary to insert a buffer circuit 300 between the instrumentation amplifier 100 and the variable-gain circuit 200 to accurately transmit the output voltage of the instrumentation amplifier 100 to the variable-gain circuit 200.

However, when the buffer circuit 300 is inserted between the instrumentation amplifier 100 and the variable-gain circuit 200, a voltage range to be transmitted to the variable-gain circuit 200 is narrowed by an offset voltage of the buffer circuit 300 (the gate-source voltage of the transistor in the example shown in FIG. 5).

SUMMARY OF THE INVENTION

According to a first aspect of the present invention, an instrumentation amplifier includes: a first input stage configured to shift a level of a first input voltage applied to a first input terminal and to output the level-shifted voltage; a second input stage configured to shift a level of a second input voltage applied to a second input terminal and to output the level-shifted voltage; a first resistor configured to generate a differential current corresponding to a difference between the voltage output from the first input stage and the voltage output from the second input stage; a second resistor configured to convert the differential current into a first output voltage; a third resistor configured to convert the differential current into a second output voltage; a first output stage configured to output the first output voltage from a first output terminal; and a second output stage configured to output the second output voltage from a second output terminal.

According to a second aspect of the present invention, in the instrumentation amplifier according to the first aspect, the first output stage may include a first transistor of which a drain terminal is connected to the first output terminal and a first end of the second resistor and a gate terminal is connected to the first input stage and a first current source connected to the drain terminal of the first transistor, the first end of the second resistor, and the first output terminal, and the second output stage may include a second transistor of which a drain terminal is connected to the second output terminal and a first end of the third resistor and a gate terminal is connected to the second input stage and a second current source connected to the drain terminal of the second transistor, the first end of the third resistor, and the second output terminal.

According to a third aspect of the present invention, in the instrumentation amplifier according to the first aspect, the first input stage may include a third transistor of which a gate terminal is connected to the first input terminal and a source terminal is connected to a first end of the first resistor, a third current source connected to the source terminal of the third transistor and the first end of the first resistor, a fourth transistor of which a drain terminal is connected to the source terminal of the third transistor, the first end of the first resistor, and a first end of the third current source, a fourth current source connected to a source terminal of the fourth transistor and a second end of the second resistor, a fifth current source connected to a drain terminal of the third transistor, and a first level shift circuit of which a first end is connected to the drain terminal of the third transistor and a second end is connected to a gate terminal of the fourth transistor, and the second input stage may include a fifth transistor of which a gate terminal is connected to the second input terminal and a source terminal is connected to a second end of the first resistor, a sixth current source connected to the source terminal of the fifth transistor and the second end of the first resistor, a sixth transistor of which a drain terminal is connected to the source terminal of the fifth transistor, the second end of the first resistor, and a first end of the sixth current source, a seventh current source connected to a source terminal of the sixth transistor and a second end of the third resistor, an eighth current source connected to the drain terminal of the fifth transistor, and a second level shift circuit of which a first end is connected to a drain terminal of the fifth transistor and a second end is connected to a gate terminal of the sixth transistor.

DETAILED DESCRIPTION OF EXEMPLARY EMBODIMENTS

Hereinafter, embodiments of the present invention will be described with reference to the accompanying drawings.
(Configuration)

Figure 1:
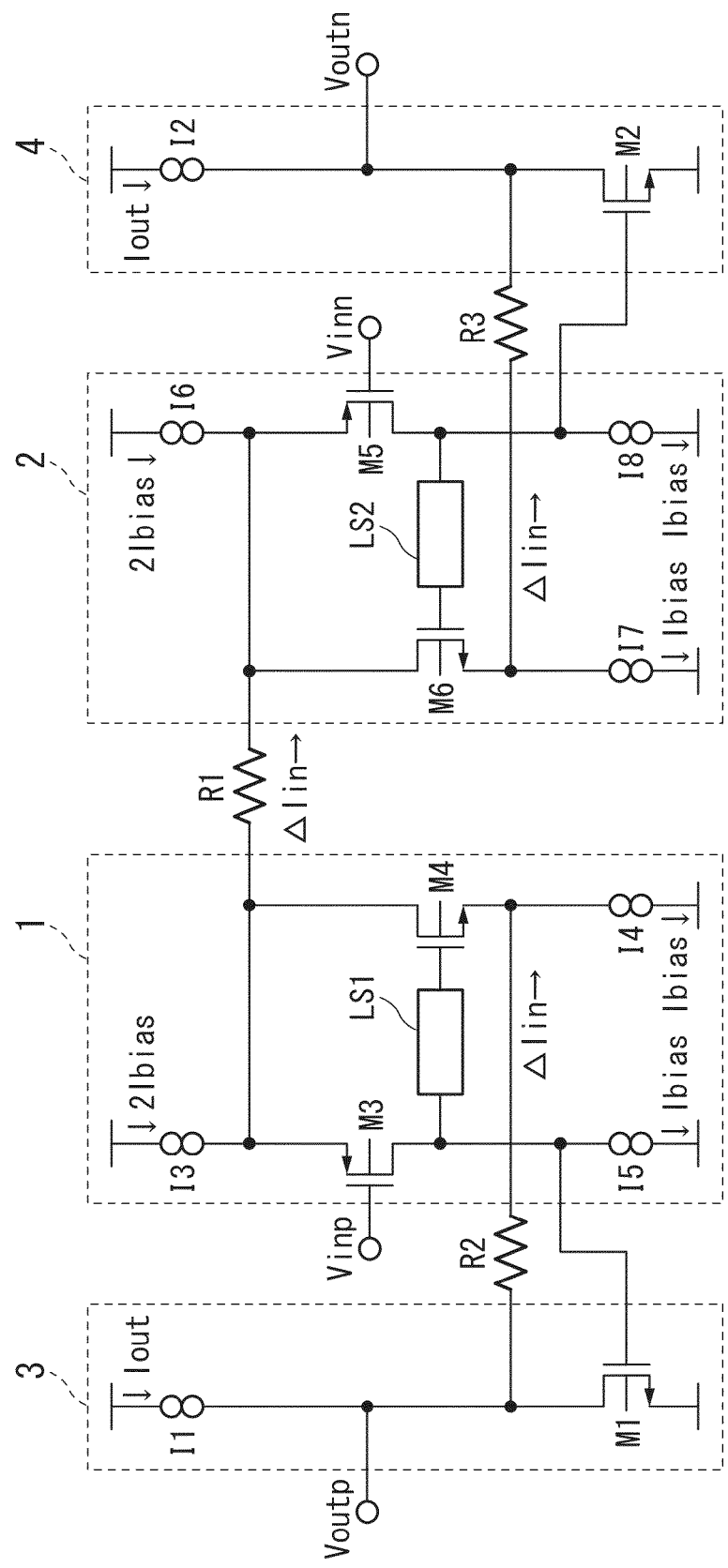
FIG. 1 is a circuit diagram showing a configuration of an instrumentation amplifier according to an embodiment of the present invention.

FIG. 1 shows a configuration of an instrumentation amplifier 10 according to an embodiment of the present invention. As shown in FIG. 1, the instrumentation amplifier 10 includes a first input stage 1, a second input stage 2, a first resistor R1, a second resistor R2, a third resistor R3, a first output stage 3, and a second output stage 4.

The first input stage 1 shifts a level of a positive input voltage (Vinp) which is a first input voltage applied to a positive input terminal (first input terminal) and outputs the level-shifted voltage. The second input stage 2 shifts a level of a negative input voltage (Vinn) which is a second input voltage applied to a negative input terminal (second input terminal) and outputs the level-shifted voltage. The first resistor R1 generates a differential current ($\Delta Iin=\Delta Vin/R1$) corresponding to a voltage of the difference ($\Delta Vin=Vinp-Vinn$) between the voltage output from the first input stage 1 and the voltage output from the second input stage 2. The second resistor R2 converts the differential current ($\Delta Iin=\Delta Vin/R1$) into a first output voltage (Voutp). The third resistor R3 converts the differential current ($\Delta Iin=\Delta Vin/R1$) into a second output voltage (Voutn). The first output stage 3 outputs the first output voltage (Voutp) from a positive output terminal (first output terminal). The second output stage 4 outputs the second output voltage (Voutn) from a negative output terminal (second output terminal).

The first output stage 3 includes a transistor M1 (first transistor) and a current source I1 (first current source). The drain terminal of the transistor M1 is connected to the positive output terminal and a first end of the second resistor R2, the gate terminal of the transistor M1 is connected to the drain terminal of a transistor M3 in the first input stage 1, and the source terminal of the transistor M1 is connected to the lowest potential. A first end of the current source I1 is connected to the drain terminal of the transistor M1, the first end of the second resistor R2, and the positive output terminal, and a second end of the current source I1 is connected to the highest potential.

The second output stage 4 includes a transistor M2 (second transistor) and a current source I2 (second current source). The drain terminal of the transistor M2 is connected to the negative output terminal and a first end of the third resistor R3, the gate terminal of the transistor M2 is connected to the drain terminal of a transistor M5 in the second input stage 2, and the source terminal of the transistor M2 is connected to the lowest potential. A first end of the current source I2 is connected to the drain terminal of the transistor M2, the first end of the third resistor R3, and the negative output terminal, and a second end of the current source I2 is connected to the highest potential.

The first input stage 1 includes transistors M3 (third transistor) and M4 (fourth transistor), current sources I3 (third current source), I4 (fourth current source), and I5 (fifth current source), and a level shift circuit LS1 (first level shift circuit). The gate terminal of the transistor M3 is connected to the positive input terminal and the source terminal of the transistor M3 is connected to a first end of the first resistor R1. A first end of the current source I3 is connected to the source terminal of the transistor M3 and the first stage of the first resistor R1, and a second end of the current source I3 is connected to the highest potential. The drain terminal of the transistor M4 is connected to the source terminal of the transistor M3, the first end of the first resistor R1, and the first end of the current source I3.

A first end of the current source I4 is connected to the source terminal of the transistor M4 and the second end of the second resistor R2, and a second end of the current source I4 is connected to the lowest potential. A first end of the current source I5 is connected to the drain terminal of the transistor M3, and a second end of the current source I5 is connected to the lowest potential. A first end of the level shift circuit LS1 is connected to the drain terminal of the transistor M3, and a second end of the level shift circuit LS1 is connected to the gate terminal of the transistor M4.

The second input stage 2 includes transistors M5 (fifth transistor) and M6 (sixth transistor), current sources I6 (sixth current source), I7 (seventh current source), and I8 (eighth current source), and a level shift circuit LS2 (second level shift circuit). The gate terminal of the transistor M5 is connected to the negative input terminal and the source terminal of the transistor M5 is connected to a second end of the first resistor R1. A first end of the current source I6 is connected to the source terminal of the transistor M5 and the second end of the first resistor R1, and a second end of the current source I6 is connected to the highest potential. The drain terminal of the transistor M6 is connected to the source terminal of the transistor M5, the second end of the first resistor R1, and the first end of the current source I6.

A first end of the current source I7 is connected to the source terminal of the transistor M6 and the second end of the third resistor R3, and a second end of the current source I7 is connected to the lowest potential. A first end of the current source I8 is connected to the drain terminal of the transistor M5, and a second end of the current source I8 is connected to the lowest potential. A first end of the level shift circuit LS2 is connected to the drain terminal of the transistor M5, and a second end of the level shift circuit LS2 is connected to the gate terminal of the transistor M6.

In this embodiment, the first resistor R1, the second resistor R2, and the third resistor R3 are formed of the same type of resistor.

The operation of the instrumentation amplifier 10 will be described below. When the positive input voltage (Vinp) is applied to the gate terminal of the transistor M3, the first input stage 1 outputs a voltage of the sum of the positive input voltage (Vinp) and the gate-source voltage (Vgs) of the transistor M3. This voltage is output from the first input stage 1 and is applied to the first end of the first resistor R1. When the negative input voltage (Vinn) is applied to the gate terminal of the transistor M5, the second input stage 2 outputs a voltage of the sum of the negative input voltage (Vinn) and the gate-source voltage (Vgs) of the transistor M5. This voltage is output from the second input stage 2 and is applied to the second end of the first resistor R1. Accordingly, the voltage of the difference ($\Delta$Vin=Vinp−Vinn) between the positive input voltage (Vinp) and the negative input voltage (Vinn) is supplied to the first resistor R1.

The first resistor R1 generates the differential current ($\Delta$Iin=$\Delta$Vin/R1) corresponding to the differential voltage ($\Delta$Vin=Vinp−Vinn) and supplies an operating current from the current sources I3 and I6 to the transistors M4 and M6 based on the differential current ($\Delta$Iin=$\Delta$Vin/R1).

The current source I3 supplies the operating current set by the current source I5 to the transistor M3 and supplies the operating current corresponding to the differential current ($\Delta$Iin=$\Delta$Vin/R1) generated in the first resistor R1 to the transistor M4. The current source I6 supplies the operating current set by the current source I8 to the transistor M5 and supplies the operating current corresponding to the differential current ($\Delta$Iin=$\Delta$Vin/R1) generated in the first resistor R1 to the transistor M6.

The current source I4 sinks the operating current of the transistor M4 which varies depending on the differential current ($\Delta$Iin=$\Delta$Vin/R1) and the operating current of the current source I1 which is supplied via the second resistor R2. The current source I7 sinks the operating current of the transistor M6 which varies depending on the differential current ($\Delta$Iin=$\Delta$Vin/R1) and the operating current of the current source I2 which is supplied via the third resistor R3.

The current source I1 supplies the operating current which is sunken via the second resistor R2 by the current source I14, the operating current of the transistor M1, and the current which is discharged via the positive output terminal. The current source I2 supplies the operating current which is sunken via the third resistor R3 by the current source I7, the operating current of the transistor M2, and the current which is discharged via the negative output terminal.

The second resistor R2 converts the differential current ($\Delta$Iin=$\Delta$Vin/R1) into the first output voltage (Voutp) and outputs the first output voltage via the first output stage 3. The third resistor R3 converts the differential current ($\Delta$Iin=$\Delta$Vin/R1) into the second output voltage (Voutn) and outputs the second output voltage via the second output stage 4.

More specifically, the differential current ($\Delta$Iin=$\Delta$Vin/R1) is a part of the operating current supplied from the current sources I3 and I6 and is expressed by Equations (6) to (8). In Equations (6) to (8), the operating currents supplied from the current sources I1, I2, I4, I5, I7, and I8 are Ibias, the operating currents supplied from the current sources I3 and I6 are 2Ibias, the operating current of the transistor M4 is Im4, and the operating current of the transistor M6 is Im6.

If positive input voltage (Vinp)>negative input voltage (Vinn), $$I_{m4} = I_{bias} - \Delta I_{in} \quad (6)$$

$$I_{m6} = I_{bias} + \Delta I_{in}$$

$$\Delta I_{in} = \frac{Vinp - Vinn}{R_1} = \frac{\Delta V_{in}}{R_1} > 0$$

If positive input voltage (Vinp)<negative input voltage (Vinn), $$I_{m4} = I_{bias} + \Delta I_{in} \quad (7)$$

$$I_{m6} = I_{bias} - \Delta I_{in}$$

$$\Delta I_{in} = \frac{Vinp - Vinn}{R_1} = \frac{\Delta V_{in}}{R_1} < 0$$

If positive input voltage (Vinp)=negative input voltage (Vinn), $$I_{m4} = I_{m6} = I_{bias} \quad (8)$$

$$\Delta I_{in} = \frac{Vinp - Vinn}{R_1} = \frac{\Delta V_{in}}{R_1} = 0$$

The differential current ($\Delta$Iin=$\Delta$Vin/R1) supplied to the second resistor R2 is supplied from the current source I1 or the transistor M1, the differential current ($\Delta$Iin=$\Delta$Vin/R1) supplied to the third resistor R3 is supplied from the current source I2 or the transistor M2. The first output voltage (Voutp) and the second output voltage (Voutn) are expressed by Equations (9) and (10).

If positive input voltage (Vinp)>negative input voltage (Vinn), $$V_{outp} = \Delta I_{in} \times R_2 = \frac{R_2}{R_1} \Delta V_{in} \quad (9)$$

$$V_{outn} = -\Delta I_{in} \times R_3 = -\frac{R_3}{R_1} \Delta V_{in} \quad (10)$$

Here, when it is assumed that the second resistor R2 and the third resistor R3 have the same resistance value (R2=R3=R2, 3) and a differential voltage between the first output voltage (Voutp) and the second output voltage (Voutn) is defined as ΔVout, Equation (11) is obtained.

$$\Delta V_{out} = V_{outp} - V_{outn} = 2\frac{R_{2,3}}{R_1} \Delta V_{in} \quad (11)$$

Equations (12) and (13) are also obtained.
If positive input voltage (Vinp)<negative input voltage (Vinn), $$V_{outp} = -\Delta I_{in} \times R_2 = -\frac{R_2}{R_1} \Delta V_{in} \quad (12)$$

$$V_{outn} = \Delta I_{in} \times R_3 = \frac{R_3}{R_1} \Delta V_{in} \quad (13)$$

Here, when it is assumed that the second resistor R2 and the third resistor R3 have the same resistance value (R2=R3=R2, 3), Equation (14) is obtained.

$$\Delta V_{out} = V_{outp} - V_{outn} = -2\frac{R_{2,3}}{R_1} \Delta V_{in} \quad (14)$$

Therefore, the instrumentation amplifier 10 amplifies the differential voltage (ΔVin=Vinp−Vinn) between the positive input voltage (Vinp) and the negative input voltage (Vinn) by 2(R2,3/R1) times based on the resistance ratio of the first resistor R1 and the second resistor R2 or the third resistor R3.

In the instrumentation amplifier 10, the operating currents supplied from the current sources I4, I5, I7, and I8 are set to Ibias, and the operating currents supplied from the current sources I3 and I6 are set to 2Ibias. In this case, the sum of currents flowing from the highest potential to the current sources I3 and I6 is equal to the sum of currents flowing from the current sources I4, I5, I7, and I8 to the lowest potential. When the operating currents supplied from the current sources I1 and I2 are defined as Iout and the differential current (ΔIin=ΔVin/R1) is made to be sufficiently smaller than Iout, the current flowing from the positive output terminal to the outside or the current flowing from the outside to the positive output terminal can be set to Iout, and the current flowing from the negative output terminal to the outside or the current flowing from the outside to the negative output terminal can be set to Iout. That is, the output current capability can be set to Iout. In order to make the differential current (ΔIin=ΔVin/R1) sufficiently smaller than Iout, a current value which is obtained by dividing an assumed differential voltage ΔVin by R1 may be calculated in advance and then the output current value (Iout) may be set to a value sufficiently greater than the calculated current value.

Figure 5:
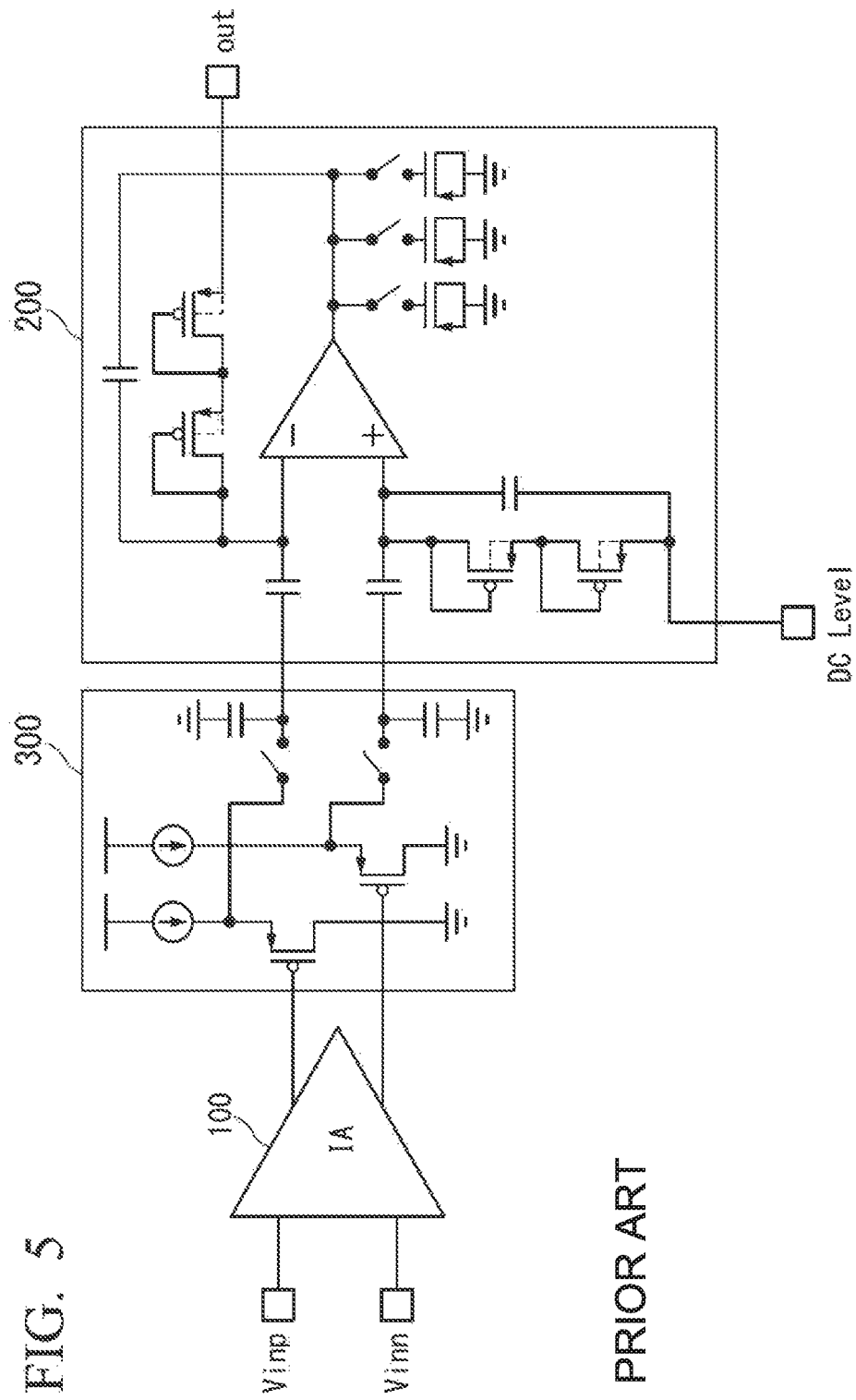
FIG. 5 is a circuit diagram showing a connection example of an instrumentation amplifier according to the related art.

Therefore, by setting the operating currents (Iout) of the current sources I1 and I2 to be larger than a current necessary for driving a circuit or load (not shown) connected to the rear stage of the instrumentation amplifier 10, the output voltage of the instrumentation amplifier 10 is not attenuated. Since it is not necessary to insert the buffer circuit 300 shown in FIG. 5 between the instrumentation amplifier 10 and the circuit or load (not shown) of the rear stage, the output voltage range of the instrumentation amplifier 10 is not narrowed.

As described above, according to this embodiment, by generating the first output voltage and the second output voltage from the differential current generated in the first resistor R1 using the second resistor R2 and the third resistor R3 and outputting the first output voltage and the second output voltage via the first output stage 3 and the second output stage 4, it is possible to enhance the output current capability without narrowing the output voltage range of the instrumentation amplifier 10.

By setting the output current value (Iout) of the instrumentation amplifier 10 to be large, it is possible to lower the output impedance of the instrumentation amplifier 10. Since the impedance in the circuit or load connected to the rear stage of the instrumentation amplifier 10 has to be larger than the output impedance of the instrumentation amplifier 10, it is possible to alleviate the limitation of impedance in the circuit or load connected to the rear stage of the instrumentation amplifier 10 by further lowering the output impedance of the instrumentation amplifier 10.

In this embodiment, the first resistor R1, the second resistor R2, and the third resistor R3 are formed of the same type of resistor, but may be formed of different types of resistors.

Figure 2:
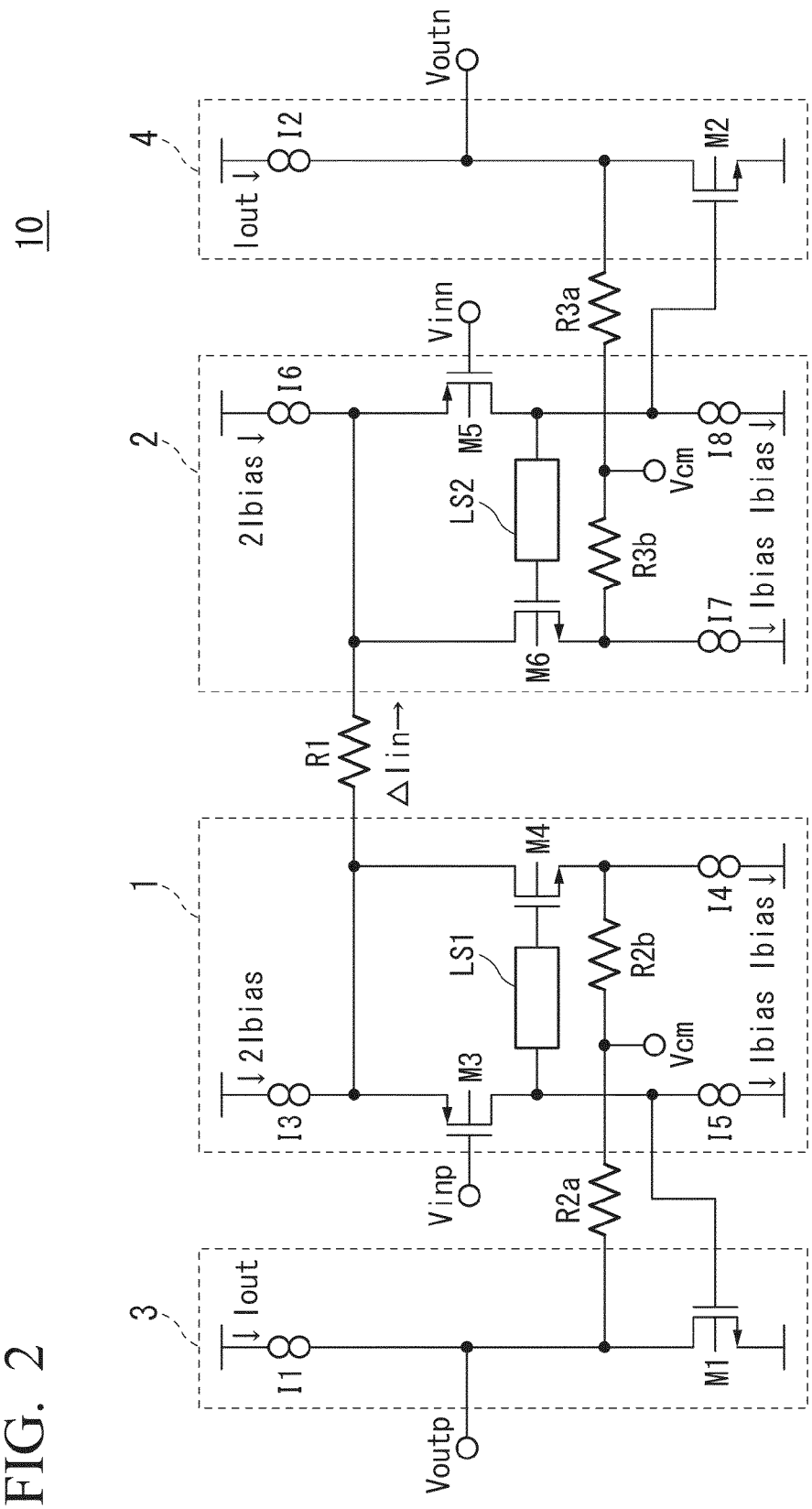
FIG. 2 is a circuit diagram showing a configuration of an instrumentation amplifier according to an embodiment of the present invention.
Figure 3:
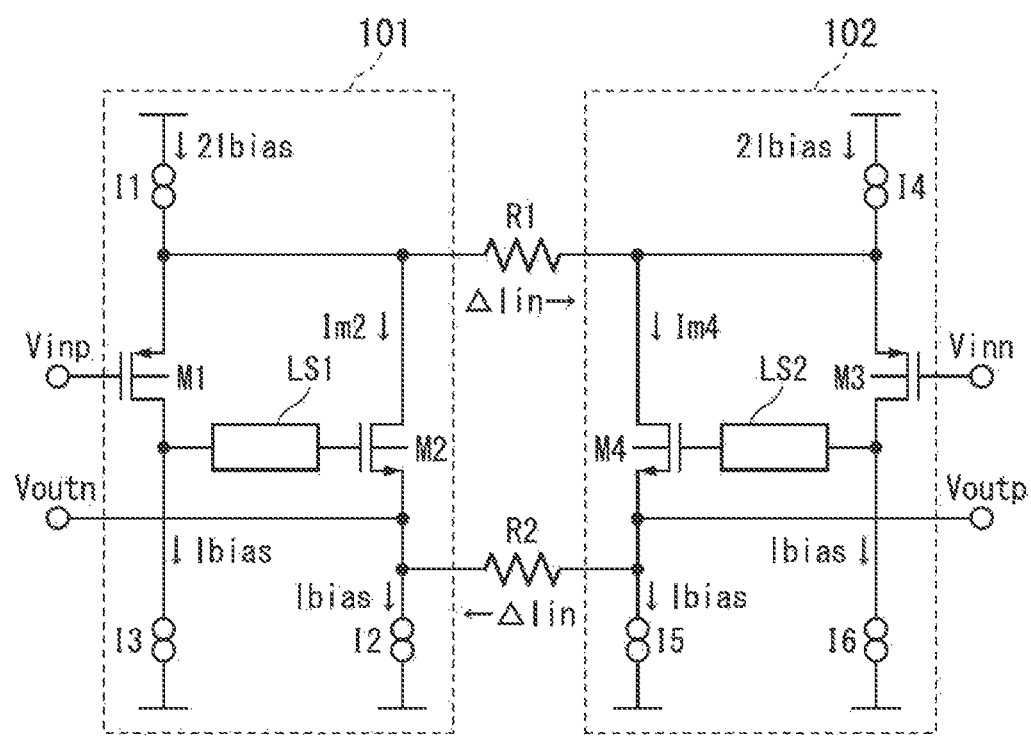
FIG. 3 is a circuit diagram showing a configuration of an instrumentation amplifier according to the related art.
Figure 4:
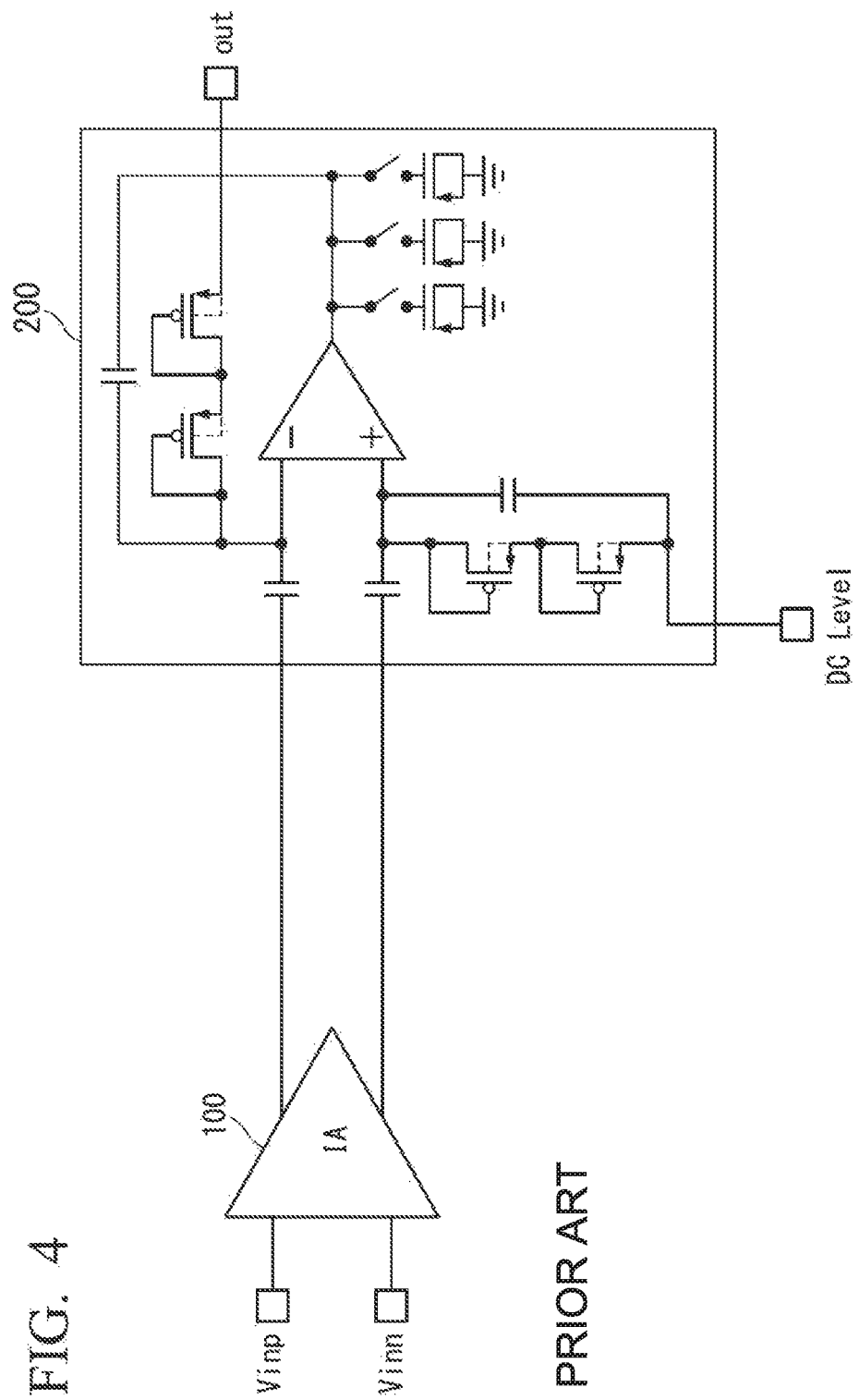
FIG. 4 is a circuit diagram showing a connection example of an instrumentation amplifier according to the related art.

In this embodiment, a circuit that determines a midpoint voltage (Vcm) of the positive output voltage and the negative output voltage is omitted, but as shown in FIG. 2, the second resistor R2 may be divided into a second resistor R2a and a second resistor R2b, the third resistor R3 may be divided into a third resistor R3a and a third resistor R3b, and a midpoint voltage (Vcm) may be connected between the divided resistors.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An instrumentation amplifier comprising:
    a first input stage configured to shift a level of a first input voltage applied to a first input terminal and to output the level-shifted voltage;
    a second input stage configured to shift a level of a second input voltage applied to a second input terminal and to output the level-shifted voltage;
    a first resistor configured to generate a differential current corresponding to a difference between the voltage output from the first input stage and the voltage output from the second input stage;
    a second resistor configured to convert the differential current into a first output voltage;
    a third resistor configured to convert the differential current into a second output voltage;
    a first output stage configured to output the first output voltage from a first output terminal; and a second output stage configured to output the second output voltage from a second output terminal.

2. The instrumentation amplifier according to claim 1, wherein the first output stage includes a first transistor of which a drain terminal is connected to the first output terminal and a first end of the second resistor and a gate terminal is connected to the first input stage, and a first current source connected to the drain terminal of the first transistor, the first end of the second resistor, and the first output terminal, and wherein the second output stage includes a second transistor of which a drain terminal is connected to the second output terminal and a first end of the third resistor and a gate terminal is connected to the second input stage, and a second current source connected to the drain terminal of the second transistor, the first end of the third resistor, and the second output terminal.

3. The instrumentation amplifier according to claim 1, wherein the first input stage includes a third transistor of which a gate terminal is connected to the first input terminal and a source terminal is connected to a first end of the first resistor, a third current source connected to the source terminal of the third transistor and the first end of the first resistor, a fourth transistor of which a drain terminal is connected to the source terminal of the third transistor, the first end of the first resistor, and a first end of the third current source, a fourth current source connected to a source terminal of the fourth transistor and a second end of the second resistor, a fifth current source connected to a drain terminal of the third transistor, and a first level shift circuit of which a first end is connected to the drain terminal of the third transistor and a second end is connected to a gate terminal of the fourth transistor, and wherein the second input stage includes a fifth transistor of which a gate terminal is connected to the second input terminal and a source terminal is connected to a second end of the first resistor, a sixth current source connected to the source terminal of the fifth transistor and the second end of the first resistor, a sixth transistor of which a drain terminal is connected to the source terminal of the fifth transistor, the second end of the first resistor, and a first end of the sixth current source, a seventh current source connected to a source terminal of the sixth transistor and a second end of the third resistor, an eighth current source connected to a drain terminal of the fifth transistor, and a second level shift circuit of which a first end is connected to the drain terminal of the fifth transistor and a second end is connected to a gate terminal of the sixth transistor.

* * * * *